(12) United States Patent
Dongaonkar et al.

(10) Patent No.: US 12,237,040 B2
(45) Date of Patent: Feb. 25, 2025

(54) METHOD AND APPARATUS TO PERFORM A READ OF A COLUMN IN A MEMORY ACCESSIBLE BY ROW AND/OR BY COLUMN

(71) Applicant: Intel Corporation, Santa Clara, CA (US)

(72) Inventors: Sourabh Dongaonkar, Portland, OR (US); Chetan Chauhan, Folsom, CA (US); Jawad B. Khan, Portland, OR (US); Sandeep K. Guliani, Folsom, CA (US); William K. Waller, Eagle, ID (US)

(73) Assignee: Intel Corporation, Santa Clara, CA (US)

( * ) Notice: Subject to any disclaimer, the term of this patent is extended or adjusted under 35 U.S.C. 154(b) by 657 days.

(21) Appl. No.: 17/468,210

(22) Filed: Sep. 7, 2021

(65) Prior Publication Data
US 2021/0407564 A1    Dec. 30, 2021

(51) Int. Cl.
*G11C 7/10*     (2006.01)
*G11C 5/02*     (2006.01)
*G11C 5/14*     (2006.01)

(52) U.S. Cl.
CPC ............ *G11C 7/1039* (2013.01); *G11C 5/025* (2013.01); *G11C 5/141* (2013.01); *G11C 7/1069* (2013.01); *G11C 7/1096* (2013.01)

(58) Field of Classification Search
CPC ... G11C 7/1039; G11C 7/1069; G11C 7/1096; G11C 5/025; G11C 5/141
See application file for complete search history.

(56) References Cited

U.S. PATENT DOCUMENTS

| | | | |
|---|---|---|---|
| 7,620,792 B2 * | 11/2009 | Maupin | G06F 12/0207 714/719 |
| 11,416,170 B2 * | 8/2022 | Khan | G06F 3/0659 |
| 2012/0286551 A1 | 11/2012 | Kumazawa | |
| 2019/0146717 A1 | 5/2019 | Khan et al. | |

OTHER PUBLICATIONS

A. Neale and M. Sachdev, "A New SEC-DED Error Correction Code Subclass for Adjacent MBU Tolerance in Embedded Memory," IEEE Transactions on Device and Materials Reliability, vol. 13, No. 1, Mar. 2013, 8 Pages.

* cited by examiner

*Primary Examiner* — Son L Mai
(74) *Attorney, Agent, or Firm* — Compass IP Law PC

(57) ABSTRACT

A memory accessed by rows and/or by columns in which an array of bits can be physically stored in multi-bit wide columns in physically contiguous rows is provided. A multi-bit wide logical column is arranged diagonally across (M/multi-bits) physical rows and (M/multi-bits) physical columns with each of the plurality of multi-bit wide logical columns in the logical row stored in a different physical row and physical multi-bit column.

20 Claims, 10 Drawing Sheets

| Address | DIE | | | | | | | | | | | | | | | | |
|---|---|---|---|---|---|---|---|---|---|---|---|---|---|---|---|---|---|
| | 0:7 | 8:15 | 16:24 | 24:31 | 32:39 | 40:47 | 48:55 | 55:63 | 64:71 | 72:79 | 80:87 | 88:95 | 96:103 | 104:111 | 111:119 | 120:127 |
| 0 | 11110111 | ###### | ###### | ###### | ###### | ###### | ###### | ###### | ###### | ###### | ###### | ###### | ###### | ###### | ###### | ###### |
| 1 | ###### | 10111111 | ###### | ###### | ###### | ###### | ###### | ###### | ###### | ###### | ###### | ###### | ###### | ###### | ###### | ###### |
| 2 | ###### | ###### | 10010111 | ###### | ###### | ###### | ###### | ###### | ###### | ###### | ###### | ###### | ###### | ###### | ###### | ###### |
| 3 | ###### | ###### | ###### | 10110111 | ###### | ###### | ###### | ###### | ###### | ###### | ###### | ###### | ###### | ###### | ###### | ###### |
| 4 | ###### | ###### | ###### | ###### | 11110110 | ###### | ###### | ###### | ###### | ###### | ###### | ###### | ###### | ###### | ###### | ###### |
| 5 | ###### | ###### | ###### | ###### | ###### | 11100111 | ###### | ###### | ###### | ###### | ###### | ###### | ###### | ###### | ###### | ###### |
| 6 | ###### | ###### | ###### | ###### | ###### | ###### | 11010111 | ###### | ###### | ###### | ###### | ###### | ###### | ###### | ###### | ###### |
| 7 | ###### | ###### | ###### | ###### | ###### | ###### | ###### | 10010101 | ###### | ###### | ###### | ###### | ###### | ###### | ###### | ###### |
| 8 | ###### | ###### | ###### | ###### | ###### | ###### | ###### | ###### | 11010110 | ###### | ###### | ###### | ###### | ###### | ###### | ###### |
| 9 | ###### | ###### | ###### | ###### | ###### | ###### | ###### | ###### | ###### | 11110001 | ###### | ###### | ###### | ###### | ###### | ###### |
| 10 | ###### | ###### | ###### | ###### | ###### | ###### | ###### | ###### | ###### | ###### | 1100110 | ###### | ###### | ###### | ###### | ###### |
| 11 | ###### | ###### | ###### | ###### | ###### | ###### | ###### | ###### | ###### | ###### | ###### | 10110000 | ###### | ###### | ###### | ###### |
| 12 | ###### | ###### | ###### | ###### | ###### | ###### | ###### | ###### | ###### | ###### | ###### | ###### | 1111111 | ###### | ###### | ###### |
| 13 | ###### | ###### | ###### | ###### | ###### | ###### | ###### | ###### | ###### | ###### | ###### | ###### | ###### | 111111 | ###### | ###### |
| 14 | ###### | ###### | ###### | ###### | ###### | ###### | ###### | ###### | ###### | ###### | ###### | ###### | ###### | ###### | 11010001 | ###### |
| 15 | ###### | ###### | ###### | ###### | ###### | ###### | ###### | ###### | ###### | ###### | ###### | ###### | ###### | ###### | ###### | 11110111 |

| Row | DIE | | | |
|---|---|---|---|---|
| | 0-40 | 41-81 | 82-122 | 123-127 |
| 0 | D0　　P0 | | | |
| 1 | | D1　　P1 | | |
| 2 | | | D2　　P2 | |
| 3 | | | | |

FIG. 6

| | DIE | | | | | |
|---|---|---|---|---|---|---|
| Row | 0-24 | 25-49 | 50-74 | 75-99 | 100-124 | 125-127 |
| 0 | D0 \| P0 | | | | | |
| 1 | | D1 \| P1 | | | | |
| 2 | | | D2 \| P2 | | | |
| 3 | | | | D3 \| P3 | | |
| 4 | | | | | D4 \| P4 | |
| 5 | | | | | | |

FIG. 7

METHOD AND APPARATUS TO PERFORM A READ OF A COLUMN IN A MEMORY ACCESSIBLE BY ROW AND/OR BY COLUMN

FIELD

This disclosure relates to a memory accessible by row and/or by column and in particular to a column read of data stored in the memory.

BACKGROUND

In matrix multiplication or matrix addition operations, data is manipulated by a compute device in rows and columns. Matrix data is stored in memory in a row-major format or column-major format. In a row-major format, consecutive elements of the rows of the matrix are stored in contiguous physical addresses in a memory device. Conversely, in a column-major format, consecutive elements of the columns are stored in contiguous physical addresses in a memory device. A matrix multiplication operation involves reading a given matrix in row-major format, reading another matrix in column-major format, and multiplying the respective rows and columns with one another.

An object recognition system for an artificial intelligence application may analyze thousands of images of objects stored in a memory so that it can learn to find visual patterns in an image to identify an object. The volume of data used in large-scale similarity searches is an extremely challenging problem that is both compute and memory intensive.

Memory that can be accessed by rows and/or by columns can allow for faster performance of processes such as similarity search, databases, and genomic analysis, among others.

BRIEF DESCRIPTION OF THE DRAWINGS

Features of embodiments of the claimed subject matter will become apparent as the following detailed description proceeds, and upon reference to the drawings, in which like numerals depict like parts, and in which:

FIG. 4 illustrates an example of an array of bits stored in multi-bit wide logical columns diagonally across physical rows/columns in a three dimensional cross-point memory die;

FIG. 5 illustrates an example of an array of bits stored in multi-bit wide logical columns diagonally across physical rows/columns in a plurality of three dimensional cross-point memory die;

FIG. 6 illustrates an example of an array of bits and column ECC (data and parity) stored in multi-bit wide logical columns diagonally across physical rows/columns in a plurality of three dimensional cross-point memory die.

FIG. 7 illustrates another example of an array of bits and column ECC (data and parity) stored in multi-bit wide logical columns diagonally across physical rows/columns in a plurality of three dimensional cross-point memory die.

Figure 1:
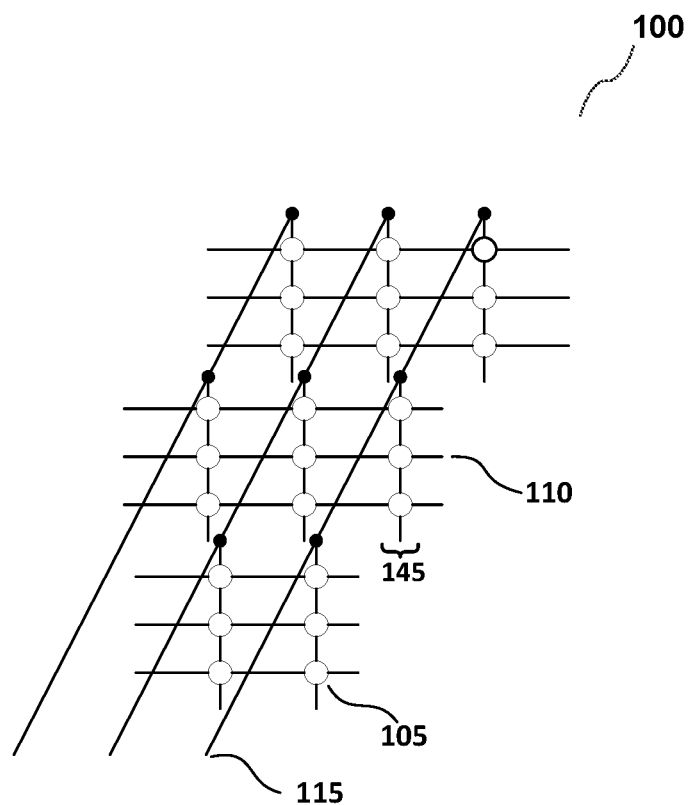
FIG. 1 is an example of a cross-point memory array that includes a plurality of memory cells.

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined as set forth in the accompanying claims.

DESCRIPTION OF EMBODIMENTS

A memory cell in a three dimensional cross-point memory can be addressed individually allowing data to be written and read on a per-bit basis. Each row of memory cells in the three dimensional cross-point memory is connected to a word line, and each column of memory cells is connected to a bit line with a memory cell located at the intersection of a word line and a bit line.

The cross-point memory can be logically partitioned into a plurality of partitions with each partition having a plurality of tiles and each tile including one or more memory cells. To perform efficient searches, database elements (for example, records, vectors, rows) are written to the cross point memory array in binary format (ones and zeros) as hash codes (sequences of values produced by a hashing function), that are sparse (have more zeros (clear bits) than ones (set bits)). The ones (set bits) encode the information and are used to search for matches. A column read can be used to read bitwise data across all of the tiles.

A delay time which can be referred to as a Partition Busy Time is required prior to a subsequent column-wise read to the same partition. The Partition Busy Time can be 20 times longer than the time to perform one read from a partition. The delay time is not required prior to a subsequent column-wise read from another partition.

To reduce the delay time, an array of bits can be physically stored in a physical block of memory in M physical rows and M physical columns such that a one-bit wide logical column is arranged diagonally across the M physical rows and M physical columns with each bit of the one-bit wide logical column in a different physical row and physical column.

The one-bit wide logical column restricts the usage of logical column reads to applications where data can be encoded in bitwise fashion and bit operations can be utilized. Furthermore, M physical rows per die need to be kept physically together in a die so that the M one-bit physical columns can be arranged diagonally across the M physical rows. Moreover, as multiple dies are typically connected to the same command-address (CA) bus, 4M rows (M rows per die) need to be kept physically together for 4 dies in parallel.

To ensure uniform wear of memory elements in the three dimensional cross-point memory, a media management operation periodically moves data within the three dimensional cross-point memory. The M physical rows and M physical columns in each of the dies must be moved together requiring 4M row reads and 4M row writes. As all of the row reads and row writes are to the same partition, the media management operation imposes a significant performance penalty.

To reduce the number of physical rows used to store the array of bits, the array of bits can be physically stored in multi-bit wide columns such that a multi-bit wide logical column is arranged diagonally across (M/multi-bits) physical rows and (M/multi-bits) physical columns with each of the plurality of multi-bit wide logical columns in the logical row stored in a different physical row and physical multi-bit column.

For example, if the number of bits per row is 128 and each multi-bit wide column has 8-bits (multi-bits is 8), the array of bits is stored in 16 columns (128/8) and 16 rows (128/8) in the three dimensional cross-point memory. The number of rows to store the array of bits with one bit per column is reduced from 128 to 16. In addition, the multi-bit wide column allows data types other than Boolean to be stored in the array of bits.

With multiple dies connected to the same Command Address (CA) bus, a multi-bit column is read from each of dies. For example, with 4 dies connected to the CA bus and each multi-bit column having 8 bits, 64 bits is read in parallel from the 4 dies for each column read. M rows per die need to be kept physically together for 4 dies in parallel. The number of rows to be written and kept physically together in the media is reduced by the number of bits stored in the multi-bit column, significantly simplifying the media management requirements. A key advantage of wide columns is the significantly reduced media management overhead.

The use of a multi-bit wide column allows a column Error Correction Code (ECC) to be embedded with the data written to the multi-bit wide column. By having columns multiple bits/bytes wide and columns ECC protected makes column ECC easier to implement in a system without a need of additional circuitry.

Reading multiple bits per column entry from the three dimensional cross-point memory alleviates media management challenges, and enables ECC corrected column reads for arbitrary data types. In addition, media management is simpler by reducing the number of rows that need to be written together and kept physically together, to keep the diagonal column structure intact.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

FIG. 1 is an example of a cross-point memory array 100 that includes a plurality of memory cells 105. The cross-point memory array 100 is a byte-addressable, write-in-place non-volatile memory. A non-volatile memory (NVM) device is a type of memory whose state is determinate even if power is interrupted to the device.

In an embodiment, each memory cell 105 includes a material with a crystalline or an amorphous atomic configuration that may have different electrical resistances. A voltage applied to the memory cell 105 results in a different current dependent on whether the material is in a crystalline or an amorphous state, and the magnitude of the resulting current may be used to determine the logic state stored by memory cell 105.

Cross-point memory array 100 may be a three dimensional cross-point memory (3D cross-point memory) array that includes a plurality of levels of two-dimensional (2D) memory arrays formed on top of one another and separated by an electrically insulating material. In the embodiment shown in FIG. 1, cross-point memory array 100 includes three levels; however, the number of levels is not limited to three. The electrically insulating material may be thermally insulating and may contain multiple sublayers to increase the thermal resistance between each level. Each level may be aligned or positioned so that memory cells 105 may be approximately aligned with one another across each level, forming a memory cell stack 145.

Each row of memory cells 105 is connected to a word line 110, and each column of memory cells 105 is connected to a bit line 115 with a memory cell 105 located at the intersection of a word line 110 and a bit line 115. In an embodiment, word lines 110 and bit lines 115 may be substantially perpendicular to one another to create an array.

The memory cells 105 can function in a two-terminal architecture with a particular word line 110 and bit line 115 serving as the electrodes for the memory cells 105. Each memory cell 105 can be addressed individually allowing data to be written and read on a per-bit basis. Word lines 110 and bit lines 115 may be made of conductive materials, such as metals (for example, copper, aluminum, gold, tungsten, titanium), metal alloys, carbon, or other conductive materials, alloys, or compounds.

In operation, a memory cell 105 of cross-point memory array 100 can be written by applying a voltage, across the memory cell 105 via a selected word line 110 and bit line 115. A memory cell 105 of the cross-point memory array 100 can be read by sensing current on a bit line 115 corresponding to the respective memory cell 105 responsive to a particular voltage applied to the selected word line 110 to which the respective memory cell is coupled.

The magnitude of the current sensed is dependent on the electrical resistance of the memory cell 105 and may be used to differentiate between the electrically resistive states of the phase change material. In some cases, sensing may depend on a threshold voltage $V^{th}$, a voltage at which point a current begins to flow.

The state of the memory cell 105 may be a low resistance crystalline state or a high resistance amorphous state, the state is used to represent whether the memory cell stores a logic (binary) '1' (a bit is "set") or logic (binary) '0' (a bit is "clear"). In an embodiment, the low resistance state represents a logic '0' and the high resistance state represents a logic '1'.

Figure 2:
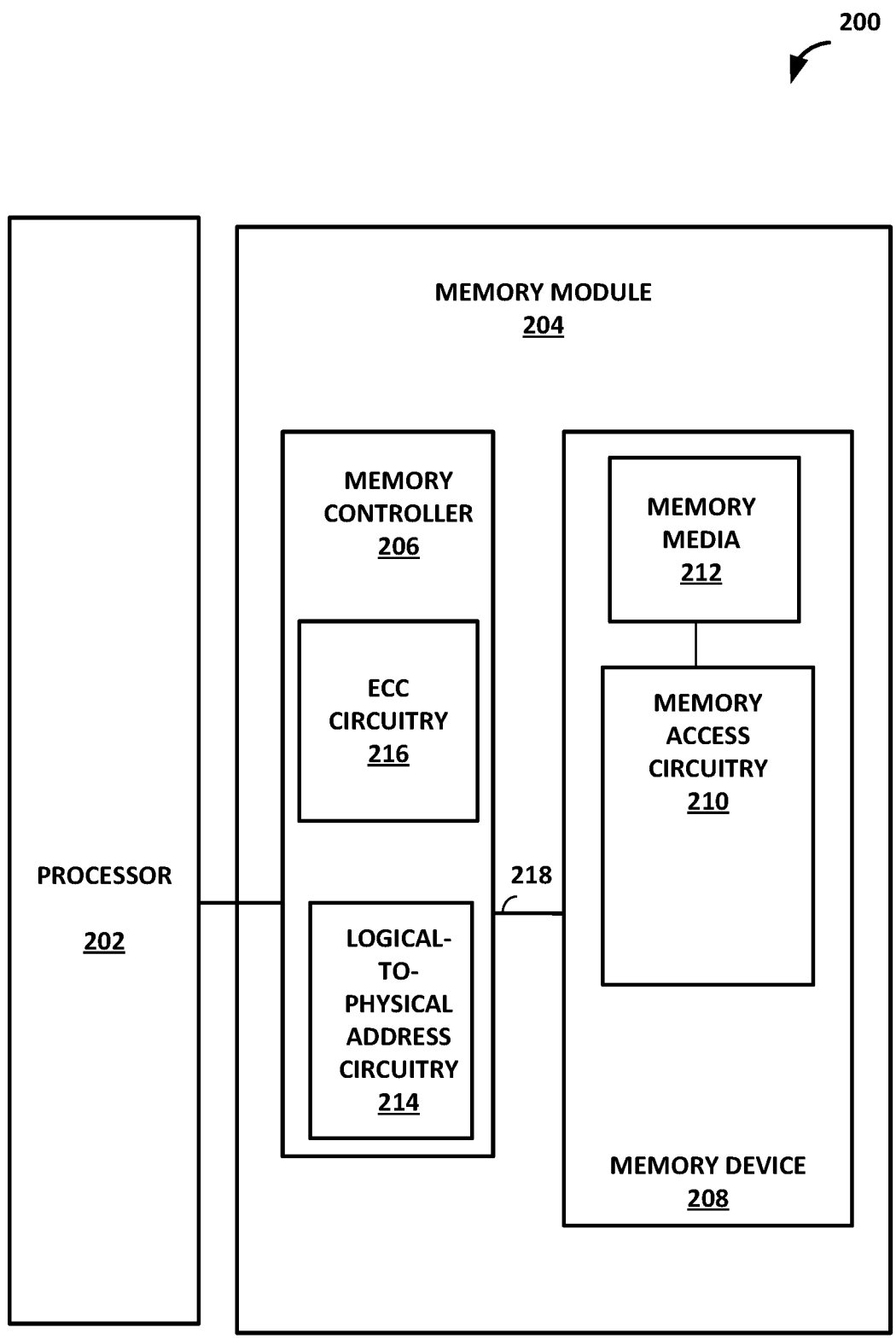
FIG. 2 is a block diagram of a compute device that includes the cross-point memory array shown in FIG. 1.

FIG. 2 is a block diagram of a compute device 200. The compute device 200 includes a processor 202 and a memory module 204. The memory module 204 can also be referred to as a memory subsystem. The memory module 204 includes a memory controller 206 and a memory device 208 connected to a shared command/address bus 218. The memory device 208 includes memory access circuitry 210 and memory media 212.

In an embodiment, the memory media is the cross-point memory array 100. The memory controller 206 includes logical-to-physical address translation circuitry 214 to convert a logical row address and a logical column address to a physical row address and a physical column address in the memory media 212 in the memory device 208.

The memory controller circuitry 206 also includes Error Correction Code (ECC) circuitry 216. Prior to writing a matrix to the memory media 212, parity bits are generated for both the rows and columns and buffered in the memory controller 206. When the matrix level parity calculations are complete, the parity and data for the matrix are written to the memory media 212. The ECC circuitry 216 can perform error correction for a column ECC and row ECC when reading a column or row.

The memory controller 206, can be any device or circuitry to selectively read from and/or write to the memory media 212, for example, in response to requests from the processor 202, which may be executing an application seeking to read from or write to the memory media 212.

The processor 202 can be embodied as any device or circuitry (e.g., a multi-core processor(s), a microcontroller, or other processor or processing/controlling circuit) capable of performing operations described herein, such as executing an application, for example, similarity search, database searches, and matrix operations. In some embodiments, the processor 202 may be embodied as, include, or be coupled to a field-programmable gate array (FPGA), an application specific integrated circuit (ASIC), a system-on-a-chip (SoC), reconfigurable hardware or hardware circuitry, or other specialized hardware to facilitate performance of the functions described herein.

The memory controller 206 can read individual bits stored in columns in the cross-point memory array 100 for use in performing similarity searches, also referred to as "stochastic associative searches" (SAS). The memory controller 206 can access multiple cells in parallel within a given partition in the cross-point memory array 100.

The cross-point memory array 100 can be logically partitioned into a plurality of partitions with each partition having a plurality of tiles. Each tile can include one or more cells 105. In an embodiment, each tile has 128 cells (bits).

Figure 3:
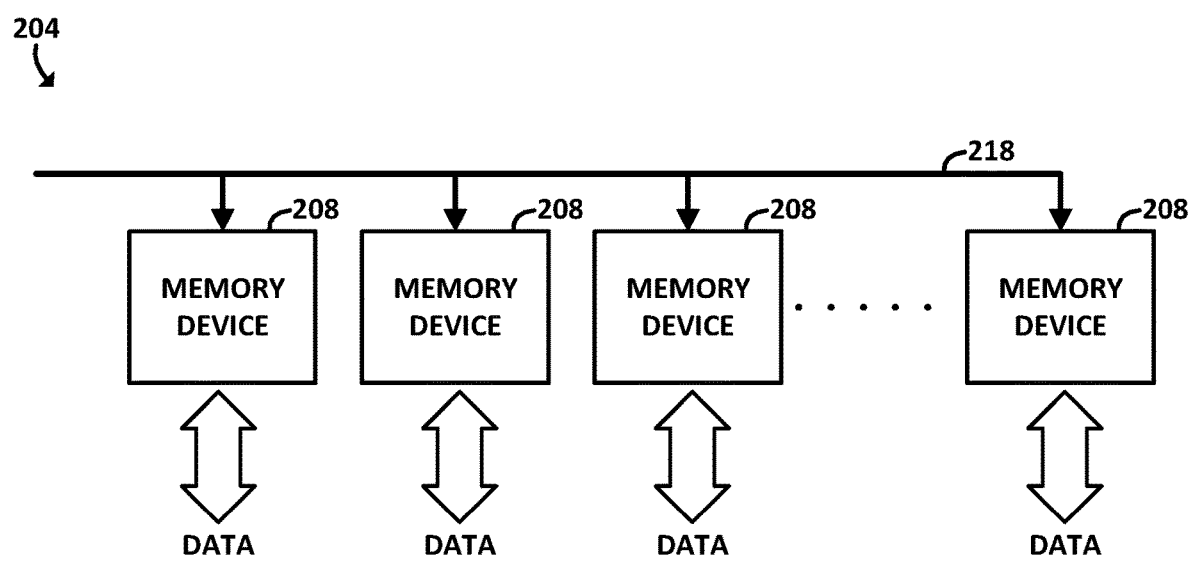
FIG. 3 is a block diagram of the memory module shown in FIG. 2 that includes multiple dies of the memory device shown in FIG. 2.

FIG. 3 is a block diagram of the memory module 204 shown in FIG. 2 that includes multiple dies of the memory device 208 shown in FIG. 2. The memory module 204 can be a Dual In-line Memory Module (DIMM). Multiple dies of the cross-point memory array 100 in the memory devices 208 on the memory module 204 are connected to a shared command/address bus 218. As such, in operation, data stored in the cross-point memory array 100 in the memory devices 208 on the memory module 204 is read in parallel from the dies of the cross-point memory array 100 in the memory devices 208 connected to the shared command/address bus 218. Data may be stored in the cross-point memory array 100 in a configuration to allow reading of entries in the same logical column that are stored in each of the dies of the cross-point memory array 100 in memory devices 208.

One of the memory devices 208 can be used to store row Error Correcting Code (ECC) for data stored in a row across a plurality of the dies of the cross-point memory array 100 in the memory module 204. Another one of the memory devices 208 can be used to store metadata for the data stored in a row across a plurality of the dies of the cross-point memory array 100 in memory devices 208 in the memory module 204. In an embodiment, there are six memory devices 208 on the memory module 204, four to store data, one to store metadata and one to store row ECC.

FIG. 4 illustrates an example of an array of bits stored in multi-bit wide logical columns diagonally across physical rows/columns in a three dimensional cross-point memory array 100. The memory controller 206 (FIG. 2) defines logical rows and logical columns in which, in a given logical column, each multi-bit entry in the logical column is stored a different physical row and physical column than any other multi-bit entry in that logical column. A first multi-bit entry in the logical column is written to a first physical row address and a first physical column address and each subsequent multi-bit entry in the logical column is written to a different subsequent physical row address and a different subsequent column address.

Each of the rows in the array of bits has a plurality of multi-bit wide columns to store multi-bit wide data. To reduce the number of physical rows in a three dimensional cross-point memory die, the array of bits is physically stored in multi-bit wide columns such that a multi-bit wide logical column is arranged diagonally across physical rows and physical columns with each of the plurality of multi-bit wide logical columns in the logical row stored in a different physical row and physical multi-bit column. The multi-bit wide column allows data types other than Boolean to be stored in the array of bits.

Each multi-wide logical column has n-bits, where n is greater than one. The n-bits can be used to store n-bits of data with no parity bits or a first portion of the n-bits can be used to store data and a second portion of the n-bits can be used to store parity. For example, n/2 bits can be used to store data and n/2 bits can be used to store parity.

An 8 bit wide logical column arranged diagonally across physical rows and physical columns is read by reading 8 bits at first physical address (row/column) and incrementing the row and column by 1 to read the next 8 bits from the next physical address (row/column).

In the example shown, each physical row is 128 bits, each physical column is 8 bits wide, and each physical row stores 16 8-bit wide columns. The array of bits is stored in 16 columns (128/8) and 16 rows (128/8) in the three dimensional cross-point memory. The first physical address for the multi-bit wide logical column arranged diagonally across 16 physical rows and 16 physical columns is row 0, column 0 and the last physical address is row 15, column 15.

Figure 5:
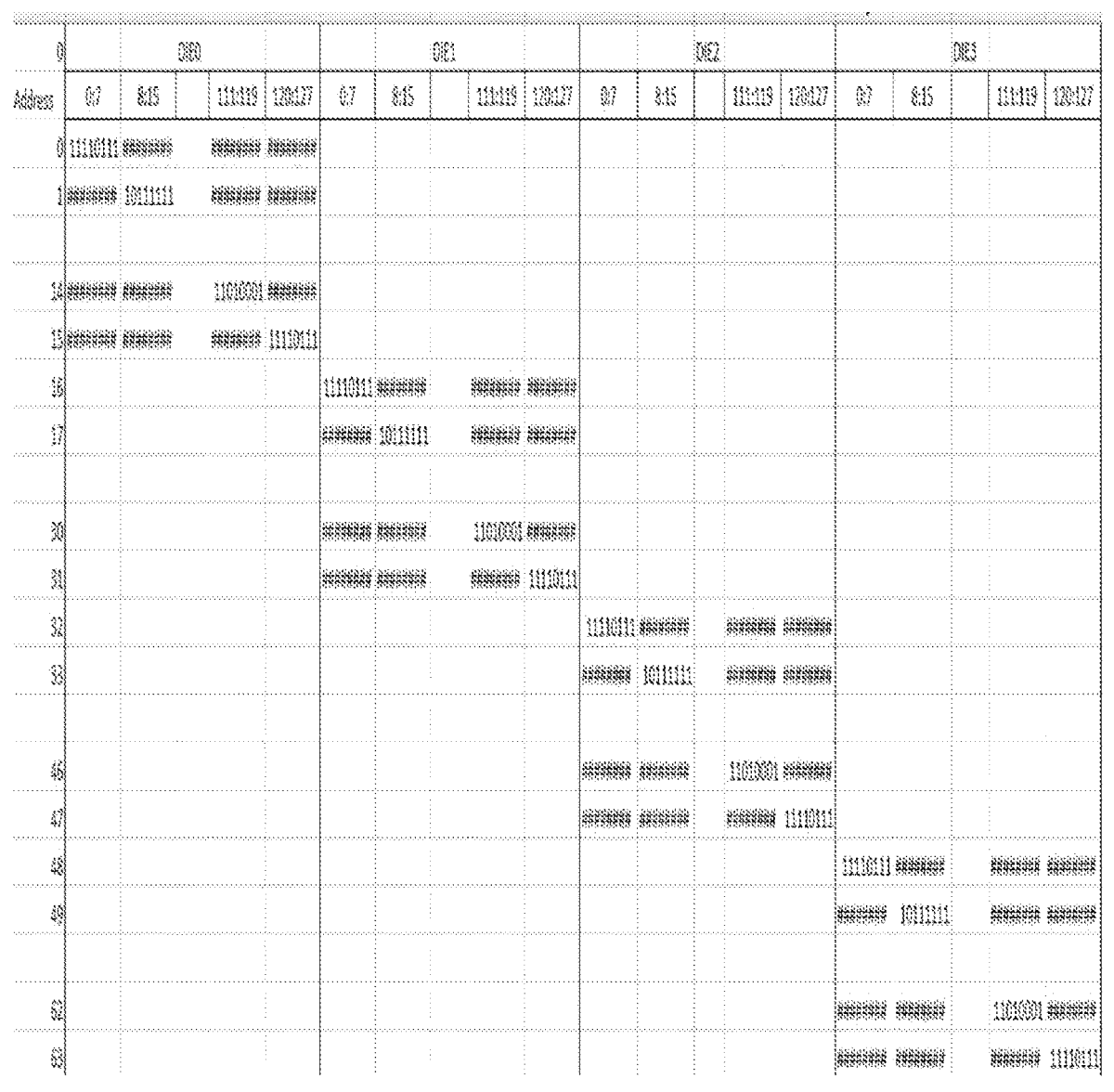

FIG. 5 illustrates an example of an array of bits stored in multi-bit wide logical columns diagonally across physical rows/columns in a plurality of three dimensional cross-point memory die.

The number of rows that need to be written together and kept physically together in the three dimensional cross-point memory die to keep the diagonal column structure intact are dependent on the number of column entries in the array of bits. The number of column entries can be increased without increasing the number of rows by storing the array of bits in multi-bit wide logical columns diagonally across physical rows/columns in a plurality of three dimensional cross-point memory die connected to the same CA bus.

The multi-bit wide logical column arranged diagonally across physical rows and physical columns is read by reading 8 bits at first address (row/column) in the first three dimensional cross-point die and incrementing the row and column by 1 to read the next 8 bits from the next address (row/column) in the first three dimensional cross-point die. After the 8-bits is read from the last address (row/column) in the first three dimensional cross-point die, the first address (row/column) in the second three dimensional cross-point die is read. The last entry of the multi-bit wide logical column is stored in the last address (row/column) of the last three dimensional cross-point die.

In the example shown in FIG. 5, there are four three dimensional cross-point memory dies. Each row has 128 bits, each column has 8 bits and each row includes 16 8-bit columns in each of the plurality of three dimensional cross-point memory dies. The array of bits is stored in 16 columns (128/8) and 16 rows (128/8) in each of the four three dimensional cross-point memory dies. The diagonal column has 64 entries. The first physical address for the multi-bit wide logical column arranged diagonally across m (where m=M/multi-bit) physical rows and m physical columns is row 0, column 0 of the first three dimensional cross-point memory die and the last physical address is row 15, column 15 of the fourth three dimensional cross-point memory die.

Storing 8 bits per entry in a diagonal column over four three dimensional cross-point memory die with each entry in a diagonal column storing one bit over four three dimensional cross-point memory dies reduces the number of rows that need to be written and kept physically together in the media by 8. Thereby, significantly simplifying the media management.

FIG. 6 illustrates an example of an array of bits and column ECC (data and parity) stored in multi-bit wide logical columns diagonally across physical rows/columns in a plurality of three dimensional cross-point memory die. The multi-bit wide logical column has a plurality of entries that are arranged diagonally across (M/multi-bit) physical rows and (M/multi-bit) physical columns.

In the example shown, each row is 128-bits and each entry in the multi-bit wide logical column has 41 bits (32-bits to store data and 9-bits to store parity). The 32-bits can be used to store data in a single-precision floating-point format, also referred to as FP32 or float32. The column ECC is independent of a row ECC.

Each column entry which is n-bits wide (data and parity) is a codeword that can be error corrected individually. Each column entry can be encoded in-place using ECC, that is, both the data and parity are stored in the same die. With each column entry to store 41 ECC bits (32 data bits and 9 parity bits), three column entries storing data in a single-precision floating-point format can be read from the die and 12 column entries can be read from four dies (3 column entries per die). Five of the 128 bits per row are not used due to the parity to data bit ratio.

The three column entries for the logical column are read by reading the first column entry (41 bits (0-40); D0 (32 data bits) and P0 (9 parity bits)) from the first physical address (row 0, column 0). The row address and column address are each incremented by 1 to read the second column entry (41 bits (41-81); D1 (32 data bits) and P1 (9 parity bits)) from the next physical address (row 1, column 1). The row address and column address are each incremented by 1 to read the third column entry (41 bits (82-123); D2 (32 data bits) and P2 (9 parity bits)) from the next physical address (row 2, column 2).

FIG. 7 illustrates another example of an array of bits and column ECC (data and parity) stored in multi-bit wide logical columns diagonally across physical rows/columns in a plurality of three dimensional cross-point memory die.

In the example shown, each row is 128-bits and each entry in the multi-bit wide logical column has 25 ECC bits (16-bits to store data and 9-bits to store parity for the data). The 16-bits can be used to store data in a half-precision floating-point format, also referred to as FP16. The column ECC is independent of a row ECC.

With each column entry to store 25 ECC bits (16 data bits and 9 parity bits), five column entries storing data in a half-precision floating-point format can be read from the die and 20 column entries can be read from four dies (5 column entries per die). Three of the 128 bits per row are not used due to the parity to data bit ratio.

The five column entries for the logical column are read by reading the first column entry (25 bits 0-24; D0 (16 data bits) and P0 (9 parity bits)) from the first physical address (row 0, column 0). The row address and column address are each incremented by 1 to read the second column entry (25 bits 25-49; D1 (16 data bits) and P1 (9 parity bits)) from the next physical address (row 1, column 1). The row address and column address are each incremented by 1 to read the third column entry (25 bits 50-74; D2 (16 data bits) and P2 (9 parity bits)) from the next physical address (row 2, column 2). The row address and column address are each incremented by 1 to read the fourth column entry (25 bits 75-99; D3 (16 data bits) and P3 (9 parity bits)) from the next physical address (row 3, column 3). The row address and column address are each incremented by 1 to read the fifth column entry (25 bits 100-124; D4 (16 data bits) and P4 (9 parity bits)) from the next physical address (row 4, column 4).

With multi-bit columns the number of rows that need to be physically together in a memory die are reduced. For example, when reading 25-bit wide columns, as shown in FIG. 6, there are 5 columns entries per die or 20 column entries across 4 dies. This reduces the number of reads/writes required to keep physical rows together during media management by a factor of 25 in contrast to a memory with one bit wide columns. This significantly reduces the performance penalty associated with media management in presence of column read.

FIG. 6 and FIG. 7 illustrate examples of two encoding schemes that can be used. Other encoding schemes with different levels of error correction and overhead can be used based on suitability, for example, Hamming Codes, Bose-Chaudhuri-Hocquenghem (BCH) codes, or Reed-Solomon codes. The encoding scheme used is dependent on how many errors need to be corrected in the media, and how many parity bits are needed to correct errors.

Figure 8:
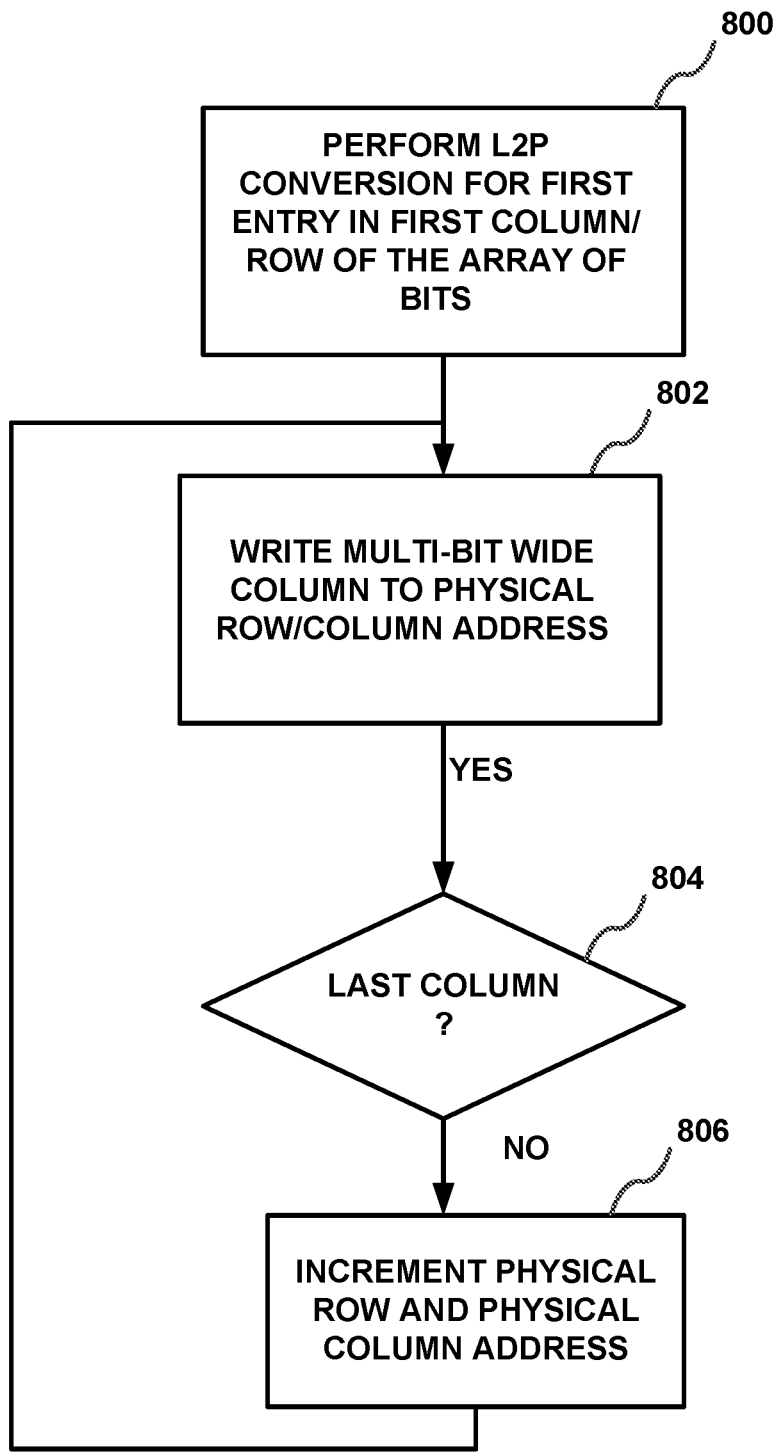
FIG. 8 is a flowgraph illustrating a method to write a multi-bit wide logical column diagonally across physical rows/columns in a three dimensional cross-point memory die.

FIG. 8 is a flowgraph illustrating a method to write a multi-bit wide logical column diagonally across physical rows/columns in a three dimensional cross-point memory die.

At block 800, the L2P circuitry 214 in the memory controller 206 performs a logical to physical address conversion for the first entry in the first column and first row of the array of bits to be stored in contiguous physical rows in the three dimensional cross-point memory die. Processing continues with block 802.

At block 802, the memory access circuitry 210 writes the multi-bit wide data to the memory at the physical row address and physical column address. Processing continues with block 804.

At block 804, the memory access circuitry 210 determines if the physical column to which the multi-wide data is the last physical column entry to be written. If there is another column entry to be written, processing continues with block 806.

At block 806, the physical row address is incremented and the physical column address is incremented and used to write the next multi-bit wide data to the memory such that the multi-bit wide data is written diagonally across the rows and columns in the array of bits.

Figure 9:
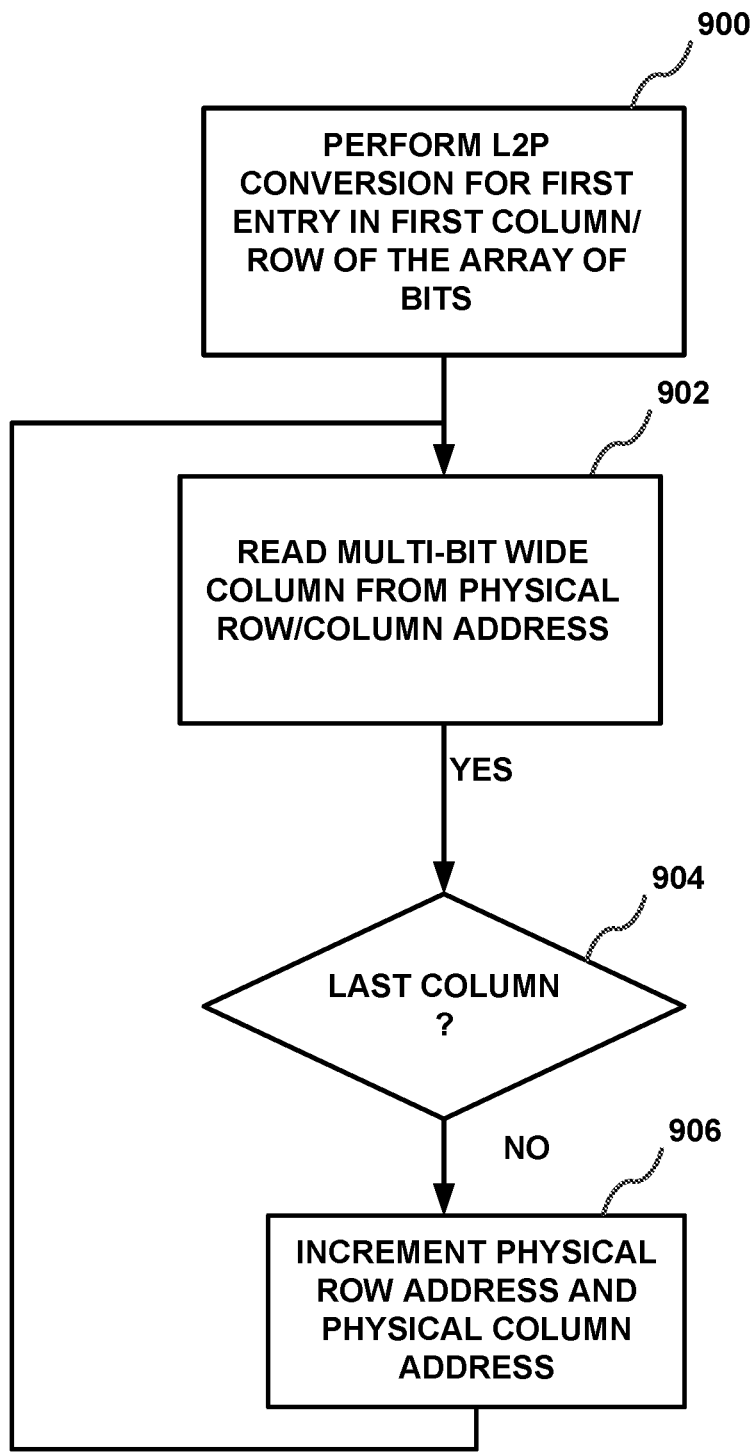
FIG. 9 is a flowgraph illustrating a method to read a multi-bit wide logical column diagonally across physical rows/columns in a three dimensional cross-point memory die.

FIG. 9 is a flowgraph illustrating a method to read a multi-bit wide logical column diagonally across physical rows/columns in a three dimensional cross-point memory die.

At block 900, the L2P circuitry 214 in memory controller 206 performs a logical to physical address conversion for the first entry in the first column and first row of the array of bits stored in a plurality of contiguous physical rows (for example, m contiguous physical rows) in the three dimensional cross-point memory die. Processing continues with block 902.

At block 902, the memory access circuitry 210 reads the multi-bit wide data from the memory media 212 at the physical row and physical column address. Processing continues with block 904.

At block 904, the memory access circuitry 210 determines if the physical column to which the multi-wide data is the last physical column entry to be read. If there is another column entry to be read, processing continues with block 906.

At block 906, the physical row address is incremented and the physical column address is incremented and used to read the next multi-bit wide data to the memory such that the multi-bit wide data is read diagonally across the rows and columns in the array of bits.

Figure 10:
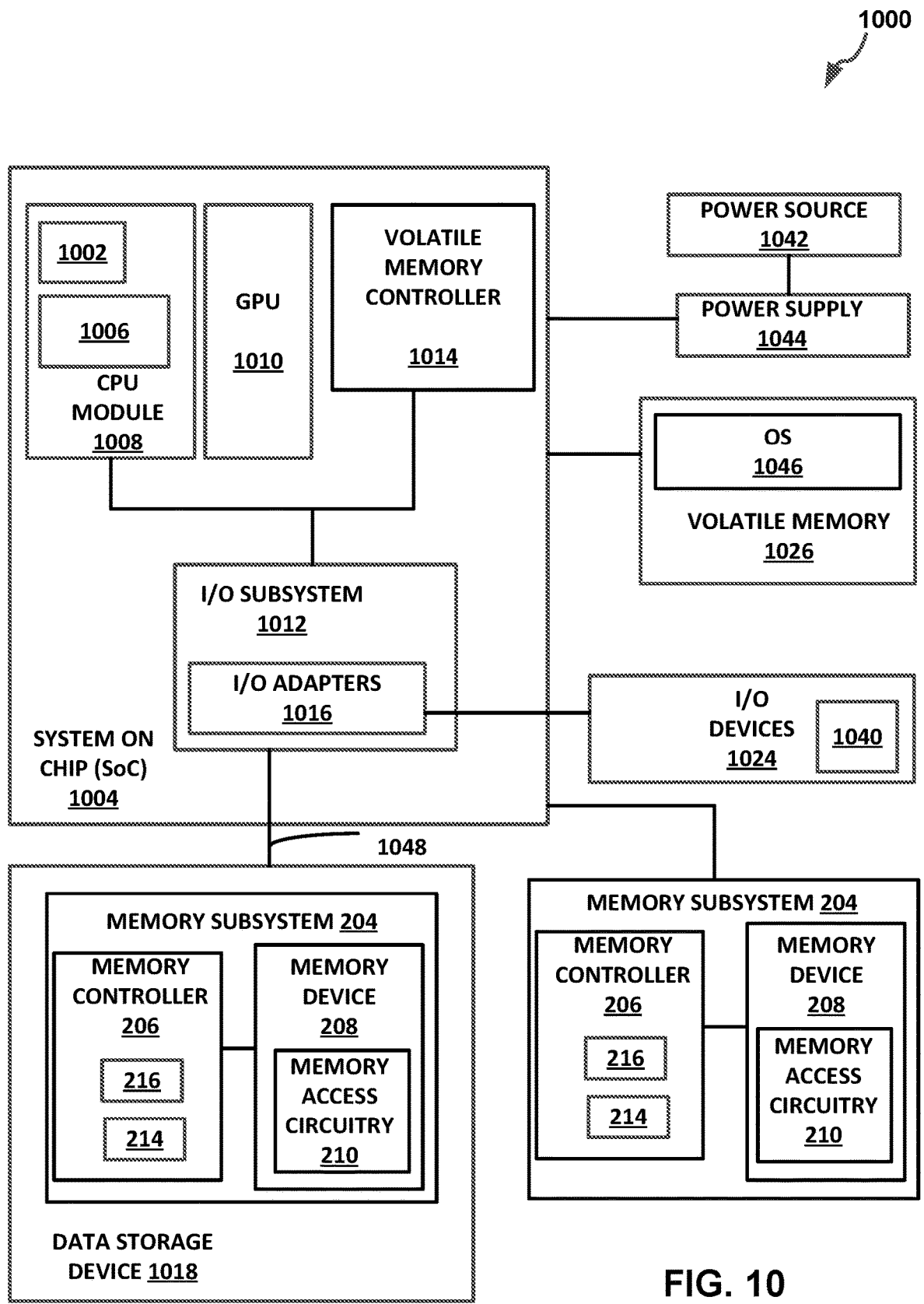
FIG. 10 is a block diagram of an embodiment of a computer system that includes the memory module.

FIG. 10 is a block diagram of an embodiment of a computer system 1000 that includes the memory module 204. Memory module 204 includes memory device 208 and memory controller 206 that includes ECC circuitry 216 and L2P address circuitry 214. Computer system 1000 can correspond to a computing device including, but not limited to, a server, a workstation computer, a desktop computer, a laptop computer, and/or a tablet computer.

The computer system 1000 includes a system on chip (SOC or SoC) 1004 which combines processor, graphics, memory, and Input/Output (I/O) control logic into one SoC package. The SoC 1004 includes at least one Central Processing Unit (CPU) module 1008, a volatile memory controller 1014, and a Graphics Processor Unit (GPU) 1010. In other embodiments, the volatile memory controller 1014 can be external to the SoC 1004. The CPU module 1008 includes at least one processor core 1002 and a level 2 (L2) cache 1006.

Although not shown, each of the processor core(s) 1002 can internally include one or more instruction/data caches, execution units, prefetch buffers, instruction queues, branch address calculation units, instruction decoders, floating point units, retirement units, etc. The CPU module 1008 can correspond to a single core or a multi-core general purpose processor, such as those provided by Intel® Corporation, according to one embodiment.

The Graphics Processor Unit (GPU) 1010 can include one or more GPU cores and a GPU cache which can store graphics related data for the GPU core. The GPU core can internally include one or more execution units and one or more instruction and data caches. Additionally, the Graphics Processor Unit (GPU) 1010 can contain other graphics logic units that are not shown in FIG. 10, such as one or more vertex processing units, rasterization units, media processing units, and codecs.

Within the I/O subsystem 1012, one or more I/O adapter(s) 1016 are present to translate a host communication protocol utilized within the processor core(s) 1002 to a protocol compatible with particular I/O devices. Some of the protocols that adapters can be utilized for translation include Peripheral Component Interconnect (PCI)-Express (PCIe); Universal Serial Bus (USB); Serial Advanced Technology Attachment (SATA) and Institute of Electrical and Electronics Engineers (IEEE) 1594 "Firewire".

The I/O adapter(s) 1016 can communicate with external I/O devices 1024 which can include, for example, user interface device(s) including a display and/or a touch-screen display 1040, printer, keypad, keyboard, communication logic, wired and/or wireless, storage device(s) including hard disk drives ("HDD"), solid-state drives ("SSD"), removable storage media, Digital Video Disk (DVD) drive, Compact Disk (CD) drive, Redundant Array of Independent Disks (RAID), tape drive or other storage device. The storage devices can be communicatively and/or physically coupled together through one or more buses using one or more of a variety of protocols including, but not limited to, SAS (Serial Attached SCSI (Small Computer System Interface)), PCIe (Peripheral Component Interconnect Express), NVMe (NVM Express) over PCIe (Peripheral Component Interconnect Express), and SATA (Serial ATA (Advanced Technology Attachment)).

Additionally, there can be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

The I/O adapter(s) 1016 can also communicate with a solid-state drive ("SSD") 1018 which includes memory module 204.

The I/O adapters 1016 can include a Peripheral Component Interconnect Express (PCIe) adapter that is communicatively coupled using the NVMe (NVM Express) over PCIe (Peripheral Component Interconnect Express) protocol over bus 1048 to the SSD 1018. Non-Volatile Memory Express (NVMe) standards define a register level interface for host software to communicate with a non-volatile memory subsystem (for example, a Solid-state Drive (SSD)) over Peripheral Component Interconnect Express (PCIe), a high-speed serial computer expansion bus). The NVM Express standards are available at www.nvmexpress.org. The PCIe standards are available at www.pcisig.com.

Volatile memory 1026 is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial specification published in September 2012 by JEDEC), DDR4E (DDR version 4, extended, currently in discussion by JEDEC), LPDDR3 (low power DDR version 3, JESD209-3B, Aug 2013 by JEDEC), LPDDR4 (LOW POWER DOUBLE DATA RATE (LPDDR) version 4, JESD209-4, originally published by JEDEC in August 2014), WI02 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5, originally published by JEDEC in January 2020, HBM2 (HBM version 2), originally published by JEDEC in January 2020, or others or combinations of memory technologies, and technologies based on derivatives or extensions of such specifications. The JEDEC standards are available at www.jedec.org.

The memory module 204 includes a byte-addressable, write-in-place memory that can be accessed by rows or columns, for example, Intel 3D XPoint™. Other examples of byte-addressable, write-in-place memory include, but are not limited to, single or multi-level Phase Change Memory (PCM) or phase change memory with a switch (PCMS), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other types of byte-addressable, write-in-place memory.

An operating system 1046 is software that manages computer hardware and software including memory allocation and access to I/O devices. Examples of operating systems include Microsoft® Windows®, Linux®, iOS® and Android®.

Power source 1042 provides power to the components of system 1000. More specifically, power source 1042 typically interfaces to one or multiple power supplies 1044 in system 1000 to provide power to the components of system 1000. In one example, power supply 1044 includes an AC to DC (alternating current to direct current) adapter to plug into a wall outlet. Such AC power can be renewable energy (e.g., solar power) power source 1042. In one example, power source 1042 includes a DC power source, such as an external AC to DC converter. In one example, power source 1042 or power supply 1044 includes wireless charging hardware to charge via proximity to a charging field. In one example, power source 1042 can include an internal battery or fuel cell source.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope.

Therefore, the illustrations and examples herein should be construed in an illustrative, and not a restrictive sense. The scope of the invention should be measured solely by reference to the claims that follow.

The following examples pertain to further embodiments. Specifics in the examples may be used anywhere in one or more embodiments.

Example 1 is an apparatus including a non-volatile memory. The non-volatile memory includes a cross-point memory array having a plurality of rows and columns of memory cells to store an array of bits, each column to store a multi-bit entry. The apparatus includes circuitry to cause storage of the multi-bit entries in a logical column in the cross-point memory array diagonally across N rows and N columns in the cross-point memory array with each multi-bit entry in the logical column stored at a different physical row address and a different physical column address.

Example 2 includes the apparatus of Example 1, optionally multi-bit entries in the logical column are stored in M physical columns in M contiguous physical rows in the cross-point memory array.

Example 3 includes the apparatus of Example 1, optionally the circuitry is to write the logical column in the array of bits, the logical column having N multi-bit entries, to write a first multi-bit entry in the logical column at a first physical row address and a first physical column address and to write each subsequent multi-bit entry in the logical column at a different subsequent physical row address and a different subsequent column address.

Example 4 includes the apparatus of Example 1, optionally a multi-bit entry including data and parity.

Example 5 includes the apparatus of Example 4, optionally the multi-bit entry including 16 bits to store data in a half-precision floating-point format and 9-bits to store parity.

Example 6 includes the apparatus of Example 4, optionally the multi-bit entry including 32 bits to store data in a single-precision floating-point format and 9-bits to store parity.

Example 7 includes the apparatus of Example 1, optionally the multi-bit entry has 8-bits, N is 16 and the array of bits is stored in 16 physical columns in 16 contiguous physical rows.

Example 8 includes the apparatus of Example 1, optionally the array of bits is stored in contiguous physical rows in the cross-point memory array.

Example 9 is a system that includes a processor and a non-volatile memory. The non-volatile memory includes a cross-point memory array having a plurality of rows and columns of memory cells to store an array of bits, each column to store a multi-bit entry. The system also includes circuitry operatively connected to the processor, the circuitry to cause storage of the multi-bit entries in a logical column in the cross-point memory array diagonally across N rows and N columns in the cross-point memory array with each multi-bit entry in the logical column stored at a different physical row address and a different physical column address.

Example 10 includes the system of Example 9, optionally multi-bit entries in the logical column are stored in M physical columns in M contiguous physical rows in the cross-point memory array.

Example 11 includes the system of Example 9, optionally the circuitry is to write the logical column in the array of bits, the logical column having N multi-bit entries, to write a first multi-bit entry in the logical column at a first physical row address and a first physical column address and to write each subsequent multi-bit entry in the logical column at a different subsequent physical row address and a different subsequent column address.

Example 12 includes the system of Example 9, optionally a multi-bit entry including data and parity.

Example 13 includes the system of Example 12, optionally the multi-bit entry including 16 bits to store data in a half-precision floating-point format and 9-bits to store parity.

Example 14 includes the system of Example 12, optionally the multi-bit entry including 32 bits to store data in a single-precision floating-point format and 9-bits to store parity.

Example 15 includes the system of Example 9, optionally the array of bits is stored in contiguous physical rows in the cross-point memory array.

Example 16 includes the system of Example 9, optionally including one or more of a display communicatively coupled to the processor or a battery coupled to the processor.

Example 17 is a method including storing a multi-bit entry in a physical row address and physical column address in a non-volatile memory. The non-volatile memory comprising a cross-point memory array having a plurality of rows and columns of memory cells to store an array of bits, each column to store a multi-bit entry. The method causing storage of multi-bit entries in a logical column in the cross-point memory array diagonally across N rows and N columns in the cross-point memory array with each multi-bit entry in the logical column stored at a different physical row address and a different physical column address.

Example 18 includes the method of Example 17, optionally multi-bit entries in the logical column are stored in M physical columns in M contiguous physical rows in the cross-point memory array.

Example 19 includes the method of Example 17, optionally writing the logical column in the array of bits, the logical column having N multi-bit entries, to write a first multi-bit entry in the logical column at a first physical row address and a first physical column address and to write each subsequent multi-bit entry in the logical column at a different subsequent physical row address and a different subsequent column address.

Example 20 includes the method of Example 17, optionally the multi-bit entry including data and parity.

What is claimed is:

1. An apparatus comprising:
a non-volatile memory comprising a cross-point memory array having a plurality of rows and columns of memory cells to store an array of bits, each column to store a multi-bit entry; and
circuitry to cause storage of the multi-bit entries in a logical column in the cross-point memory array diagonally across N rows and N columns in the cross-point memory array with each multi-bit entry in the logical column stored at a different physical row address and a different physical column address.

2. The apparatus of claim 1, wherein multi-bit entries in the logical column are stored in M physical columns in M contiguous physical rows in the cross-point memory array.

3. The apparatus of claim 1, wherein the circuitry is to:
write the logical column in the array of bits, the logical column having N multi-bit entries, to write a first multi-bit entry in the logical column at a first physical row address and a first physical column address and to write each subsequent multi-bit entry in the logical column at a different subsequent physical row address and a different subsequent column address.

4. The apparatus of claim 1, wherein the multi-bit entry including data and parity.

5. The apparatus of claim 4, wherein the multi-bit entry including 16 bits to store data in a half-precision floating-point format and 9-bits to store parity.

6. The apparatus of claim 4, wherein the multi-bit entry including 32 bits to store data in a single-precision floating-point format and 9-bits to store parity.

7. The apparatus of claim 1, wherein the multi-bit entry has 8-bits, N is 16 and the array of bits is stored in 16 physical columns in 16 contiguous physical rows.

8. The apparatus of claim 1, wherein the array of bits is stored in contiguous physical rows in the cross-point memory array.

9. A system comprising:
a processor;
a non-volatile memory comprising a cross-point memory array having a plurality of rows and columns of memory cells to store an array of bits, each column to store a multi-bit entry; and
circuitry operatively connected to the processor, the circuitry to cause storage of the multi-bit entries in a logical column in the cross-point memory array diagonally across N rows and N columns in the cross-point memory array with each multi-bit entry in the logical column stored at a different physical row address and a different physical column address.

10. The system of claim 9, wherein multi-bit entries in the logical column are stored in M physical columns in M contiguous physical rows in the cross-point memory array.

11. The system of claim 9, wherein the circuitry is to:
write the logical column in the array of bits, the logical column having N multi-bit entries, to write a first multi-bit entry in the logical column at a first physical row address and a first physical column address and to write each subsequent multi-bit entry in the logical column at a different subsequent physical row address and a different subsequent column address.

12. The system of claim 9, wherein the multi-bit entry including data and parity.

13. The system of claim 12, wherein the multi-bit entry including 16 bits to store data in a half-precision floating-point format and 9-bits to store parity.

14. The system of claim 12, wherein the multi-bit entry including 32 bits to store data in a single-precision floating-point format and 9-bits to store parity.

15. The system of claim 9, wherein the array of bits is stored in contiguous physical rows in the cross-point memory array.

16. The system of claim 9, further comprising one or more of:
   a display communicatively coupled to the processor; or
   a battery coupled to the processor.

17. A method comprising:
   storing a multi-bit entry in a physical row address and physical column address in a non-volatile memory comprising a cross-point memory array having a plurality of rows and columns of memory cells to store an array of bits, each column to store one multi-bit entry; and
   causing storage of multi-bit entries in a logical column in the cross-point memory array diagonally across N rows and N columns in the cross-point memory array with each multi-bit entry in the logical column stored at a different physical row address and a different physical column address.

18. The method of claim 17, wherein multi-bit entries in the logical column are stored in M physical columns in M contiguous physical rows in the cross-point memory array.

19. The method of claim 17, further comprising:
   writing the logical column in the array of bits, the logical column having N multi-bit entries, to write a first multi-bit entry in the logical column at a first physical row address and a first physical column address and to write each subsequent multi-bit entry in the logical column at a different subsequent physical row address and a different subsequent column address.

20. The method of claim 17, wherein the multi-bit entry including data and parity.

* * * * *